(12) United States Patent
Haba et al.

(10) Patent No.: US 8,637,968 B2
(45) Date of Patent: Jan. 28, 2014

(54) STACKED MICROELECTRONIC ASSEMBLY HAVING INTERPOSER CONNECTING ACTIVE CHIPS

(75) Inventors: Belgacem Haba, Saratoga, CA (US);
Vage Oganesian, Palo Alto, CA (US);
Ilyas Mohammed, Santa Clara, CA (US); Piyush Savalia, Santa Clara, CA (US); Craig Mitchell, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 404 days.

(21) Appl. No.: 12/958,866

(22) Filed: Dec. 2, 2010

(65) Prior Publication Data

US 2012/0139094 A1    Jun. 7, 2012

(51) Int. Cl.
*H01L 23/48* (2006.01)
*H01L 23/02* (2006.01)
*H01L 29/40* (2006.01)

(52) U.S. Cl.
USPC ............................ 257/686; 257/276; 257/777

(58) Field of Classification Search
USPC ......................................... 257/276, 686, 777
See application file for complete search history.

(56) References Cited

U.S. PATENT DOCUMENTS

| | | | |
|---|---|---|---|
| 4,682,074 A | 7/1987 | Hoeberechts et al. | |
| 4,765,864 A | 8/1988 | Holland et al. | |
| 5,229,647 A | 7/1993 | Gnadinger | |
| 5,322,816 A | 6/1994 | Pinter | |
| 5,481,133 A | 1/1996 | Hsu | |
| 5,686,762 A | 11/1997 | Langley | |
| 5,700,735 A | 12/1997 | Shiue et al. | |
| 5,703,408 A | 12/1997 | Ming-Tsung et al. | |
| 5,808,874 A | 9/1998 | Smith | |
| 6,005,466 A | 12/1999 | Pedder | |
| 6,013,948 A | 1/2000 | Akram et al. | |

(Continued)

FOREIGN PATENT DOCUMENTS

| | | |
|---|---|---|
| EP | 0316799 A1 | 5/1989 |
| EP | 0926723 A1 | 6/1999 |

(Continued)

OTHER PUBLICATIONS

David R. Lide et al: 'Handbook of Chemistry and Physics, 77th Edition, 1996-1997', Jan. 1, 1997, CRC Press, Boca Raton, New York, London, Tokyo, XP002670569, pp. 12-90-12-91.

(Continued)

*Primary Examiner* — James Mitchell
(74) *Attorney, Agent, or Firm* — Lerner, David, Littenberg, Krumholz & Mentlik, LLP

(57) ABSTRACT

A microelectronic assembly can include first and second microelectronic elements each embodying active semiconductor devices adjacent a front surface thereof, and having an electrically conductive pad exposed at the respective front surface. An interposer of material having a CTE less than 10 ppm/° C. has first and second surfaces attached to the front surfaces of the respective first and second microelectronic elements, the interposer having a second conductive element extending within an opening in the interposer. First and second conductive elements extend within openings extending from the rear surface of a respective microelectronic element of the first and second microelectronic elements towards the front surface of the respective microelectronic element. In one example, one or more of the first or second conductive elements extends through the respective first or second pad, and the conductive elements contact the exposed portions of the second conductive element to provide electrical connection therewith.

33 Claims, 7 Drawing Sheets

(56) References Cited

U.S. PATENT DOCUMENTS

| | | | |
|---|---|---|---|
| 6,022,758 A | 2/2000 | Badehi | |
| 6,031,274 A | 2/2000 | Muramatsu et al. | |
| 6,103,552 A | 8/2000 | Lin | |
| 6,143,369 A | 11/2000 | Sugawa et al. | |
| 6,143,396 A | 11/2000 | Saran et al. | |
| 6,169,319 B1 | 1/2001 | Malinovich et al. | |
| 6,181,016 B1 | 1/2001 | Lin et al. | |
| 6,261,865 B1 | 7/2001 | Akram | |
| 6,277,669 B1 | 8/2001 | Kung et al. | |
| 6,284,563 B1 | 9/2001 | Fjelstad | |
| 6,313,540 B1 | 11/2001 | Kida et al. | |
| 6,362,529 B1 | 3/2002 | Sumikawa et al. | |
| 6,368,410 B1 | 4/2002 | Gorczyca et al. | |
| 6,399,892 B1 | 6/2002 | Milkovich et al. | |
| 6,472,247 B1 | 10/2002 | Andoh et al. | |
| 6,492,201 B1 | 12/2002 | Haba | |
| 6,498,381 B2 | 12/2002 | Halahan et al. | |
| 6,498,387 B1 | 12/2002 | Yang | |
| 6,507,113 B1 | 1/2003 | Fillion et al. | |
| 6,586,955 B2 | 7/2003 | Fjelstad et al. | |
| 6,608,377 B2 | 8/2003 | Chang et al. | |
| 6,638,352 B2 | 10/2003 | Satsu et al. | |
| 6,693,358 B2 | 2/2004 | Yamada et al. | |
| 6,716,737 B2 | 4/2004 | Plas et al. | |
| 6,727,576 B2 | 4/2004 | Hedler et al. | |
| 6,737,300 B2 | 5/2004 | Ding et al. | |
| 6,743,660 B2 | 6/2004 | Lee et al. | |
| 6,812,549 B2 | 11/2004 | Umetsu et al. | |
| 6,828,175 B2 | 12/2004 | Wood et al. | |
| 6,864,172 B2 | 3/2005 | Noma et al. | |
| 6,867,123 B2 | 3/2005 | Katagiri et al. | |
| 6,873,054 B2 | 3/2005 | Miyazawa et al. | |
| 6,879,049 B1 | 4/2005 | Yamamoto et al. | |
| 6,927,156 B2 | 8/2005 | Mathew | |
| 6,982,475 B1 | 1/2006 | MacIntyre | |
| 7,026,175 B2 | 4/2006 | Li et al. | |
| 7,068,139 B2 | 6/2006 | Harris et al. | |
| 7,091,062 B2 | 8/2006 | Geyer | |
| 7,271,033 B2 | 9/2007 | Lin et al. | |
| 7,329,563 B2 | 2/2008 | Lo et al. | |
| 7,413,929 B2 | 8/2008 | Lee et al. | |
| 7,420,257 B2 | 9/2008 | Shibayama | |
| 7,436,069 B2 | 10/2008 | Matsui | |
| 7,446,036 B1 | 11/2008 | Bolom et al. | |
| 7,456,479 B2 | 11/2008 | Lan | |
| 7,531,445 B2 | 5/2009 | Shiv | |
| 7,531,453 B2 | 5/2009 | Kirby et al. | |
| 7,719,121 B2 | 5/2010 | Humpston et al. | |
| 7,750,487 B2 | 7/2010 | Muthukumar et al. | |
| 7,754,531 B2 | 7/2010 | Tay et al. | |
| 7,767,497 B2 | 8/2010 | Haba | |
| 7,781,781 B2 | 8/2010 | Adkisson et al. | |
| 7,791,199 B2 | 9/2010 | Grinman et al. | |
| 7,807,508 B2 | 10/2010 | Oganesian et al. | |
| 7,829,976 B2* | 11/2010 | Kirby et al. | 257/621 |
| 7,901,989 B2 | 3/2011 | Haba et al. | |
| 7,915,710 B2* | 3/2011 | Lee et al. | 257/621 |
| 7,935,568 B2 | 5/2011 | Oganesian et al. | |
| 8,008,121 B2* | 8/2011 | Choi et al. | 438/107 |
| 8,008,192 B2 | 8/2011 | Sulfridge | |
| 8,193,615 B2 | 6/2012 | Haba et al. | |
| 8,253,244 B2* | 8/2012 | Kang | 257/724 |
| 8,263,434 B2* | 9/2012 | Pagaila et al. | 438/109 |
| 8,299,608 B2* | 10/2012 | Bartley et al. | 257/712 |
| 8,421,193 B2* | 4/2013 | Huang | 257/621 |
| 2001/0048591 A1 | 12/2001 | Fjelstad et al. | |
| 2002/0061723 A1 | 5/2002 | Duescher | |
| 2002/0096787 A1 | 7/2002 | Fjelstad | |
| 2002/0109236 A1 | 8/2002 | Kim et al. | |
| 2002/0151171 A1 | 10/2002 | Furusawa | |
| 2003/0059976 A1 | 3/2003 | Nathan et al. | |
| 2003/0071331 A1 | 4/2003 | Yamaguchi et al. | |
| 2003/0178714 A1 | 9/2003 | Sakoda et al. | |
| 2004/0016942 A1 | 1/2004 | Miyazawa et al. | |
| 2004/0017012 A1 | 1/2004 | Yamada et al. | |
| 2004/0043607 A1 | 3/2004 | Farnworth et al. | |
| 2004/0051173 A1 | 3/2004 | Koh et al. | |
| 2004/0061238 A1 | 4/2004 | Sekine | |
| 2004/0104454 A1 | 6/2004 | Takaoka et al. | |
| 2004/0155354 A1 | 8/2004 | Hanaoka et al. | |
| 2004/0173891 A1* | 9/2004 | Imai et al. | 257/686 |
| 2004/0178495 A1 | 9/2004 | Yean et al. | |
| 2004/0188819 A1 | 9/2004 | Farnworth et al. | |
| 2004/0188822 A1 | 9/2004 | Hara | |
| 2004/0217483 A1 | 11/2004 | Hedler et al. | |
| 2004/0222508 A1 | 11/2004 | Aoyagi | |
| 2004/0251525 A1 | 12/2004 | Zilber et al. | |
| 2004/0259292 A1 | 12/2004 | Beyne et al. | |
| 2005/0012225 A1 | 1/2005 | Choi et al. | |
| 2005/0046002 A1 | 3/2005 | Lee et al. | |
| 2005/0051883 A1 | 3/2005 | Fukazawa | |
| 2005/0056903 A1 | 3/2005 | Yamamoto et al. | |
| 2005/0106845 A1 | 5/2005 | Halahan et al. | |
| 2005/0156330 A1 | 7/2005 | Harris | |
| 2005/0248002 A1 | 11/2005 | Newman et al. | |
| 2005/0260794 A1 | 11/2005 | Lo et al. | |
| 2005/0279916 A1 | 12/2005 | Kang et al. | |
| 2005/0282374 A1 | 12/2005 | Hwang et al. | |
| 2005/0287783 A1 | 12/2005 | Kirby et al. | |
| 2006/0001174 A1 | 1/2006 | Matsui | |
| 2006/0001179 A1* | 1/2006 | Fukase et al. | 257/778 |
| 2006/0017161 A1 | 1/2006 | Chung et al. | |
| 2006/0043598 A1 | 3/2006 | Kirby et al. | |
| 2006/0046348 A1 | 3/2006 | Kang | |
| 2006/0046463 A1 | 3/2006 | Watkins et al. | |
| 2006/0046471 A1 | 3/2006 | Kirby et al. | |
| 2006/0068580 A1 | 3/2006 | Dotta | |
| 2006/0071347 A1 | 4/2006 | Dotta | |
| 2006/0076019 A1 | 4/2006 | Ho | |
| 2006/0079019 A1 | 4/2006 | Kim | |
| 2006/0094231 A1 | 5/2006 | Lane et al. | |
| 2006/0115932 A1 | 6/2006 | Farnworth et al. | |
| 2006/0154446 A1 | 7/2006 | Wood et al. | |
| 2006/0175697 A1 | 8/2006 | Kurosawa et al. | |
| 2006/0197216 A1 | 9/2006 | Yee | |
| 2006/0197217 A1 | 9/2006 | Yee | |
| 2006/0264029 A1 | 11/2006 | Heck et al. | |
| 2006/0278898 A1 | 12/2006 | Shibayama | |
| 2006/0278997 A1 | 12/2006 | Gibson et al. | |
| 2006/0292866 A1 | 12/2006 | Borwick et al. | |
| 2007/0035020 A1 | 2/2007 | Umemoto | |
| 2007/0052050 A1 | 3/2007 | Dierickx | |
| 2007/0096295 A1 | 5/2007 | Burtzlaff et al. | |
| 2007/0126085 A1 | 6/2007 | Kawano et al. | |
| 2007/0194427 A1 | 8/2007 | Choi et al. | |
| 2007/0231966 A1 | 10/2007 | Egawa | |
| 2007/0249095 A1 | 10/2007 | Song et al. | |
| 2007/0262464 A1 | 11/2007 | Watkins et al. | |
| 2007/0269931 A1 | 11/2007 | Chung et al. | |
| 2007/0290300 A1 | 12/2007 | Kawakami | |
| 2008/0002460 A1 | 1/2008 | Tuckerman et al. | |
| 2008/0020898 A1 | 1/2008 | Pyles et al. | |
| 2008/0032448 A1* | 2/2008 | Simon et al. | 438/107 |
| 2008/0076195 A1 | 3/2008 | Shiv | |
| 2008/0079779 A1 | 4/2008 | Cornell et al. | |
| 2008/0090333 A1 | 4/2008 | Haba et al. | |
| 2008/0099009 A1 | 5/2008 | Oganesian et al. | |
| 2008/0099907 A1 | 5/2008 | Oganesian et al. | |
| 2008/0111213 A1 | 5/2008 | Akram et al. | |
| 2008/0116544 A1 | 5/2008 | Grinman et al. | |
| 2008/0136038 A1 | 6/2008 | Savastiouk et al. | |
| 2008/0150089 A1 | 6/2008 | Kwon et al. | |
| 2008/0157273 A1 | 7/2008 | Giraudin et al. | |
| 2008/0164574 A1 | 7/2008 | Savastiouk et al. | |
| 2008/0185719 A1 | 8/2008 | Cablao et al. | |
| 2008/0230923 A1 | 9/2008 | Jo et al. | |
| 2008/0246136 A1 | 10/2008 | Haba et al. | |
| 2008/0274589 A1 | 11/2008 | Lee et al. | |
| 2008/0284041 A1 | 11/2008 | Jang et al. | |
| 2009/0014843 A1 | 1/2009 | Kawashita et al. | |
| 2009/0026566 A1 | 1/2009 | Oliver et al. | |
| 2009/0032951 A1 | 2/2009 | Andry et al. | |
| 2009/0032966 A1 | 2/2009 | Lee et al. | |
| 2009/0039491 A1 | 2/2009 | Kim et al. | |

(56) References Cited

U.S. PATENT DOCUMENTS

| | | |
|---|---|---|
| 2009/0045504 A1 | 2/2009 | Suh |
| 2009/0065907 A1 | 3/2009 | Haba et al. |
| 2009/0085208 A1 | 4/2009 | Uchida |
| 2009/0133254 A1 | 5/2009 | Kubota et al. |
| 2009/0134498 A1 | 5/2009 | Ikeda et al. |
| 2009/0148591 A1 | 6/2009 | Wang et al. |
| 2009/0212381 A1 | 8/2009 | Crisp et al. |
| 2009/0224372 A1 | 9/2009 | Johnson |
| 2009/0263214 A1 | 10/2009 | Lee et al. |
| 2009/0267183 A1 | 10/2009 | Temple et al. |
| 2009/0267194 A1* | 10/2009 | Chen .................. 257/621 |
| 2009/0294983 A1 | 12/2009 | Cobbley et al. |
| 2009/0309235 A1 | 12/2009 | Suthiwongsunthorn et al. |
| 2010/0013060 A1 | 1/2010 | Lamy et al. |
| 2010/0038778 A1* | 2/2010 | Lee et al. ............ 257/737 |
| 2010/0117242 A1 | 5/2010 | Miller et al. |
| 2010/0127346 A1 | 5/2010 | DeNatale et al. |
| 2010/0148371 A1 | 6/2010 | Kaskoun et al. |
| 2010/0155940 A1 | 6/2010 | Kawashita et al. |
| 2010/0159699 A1 | 6/2010 | Takahashi |
| 2010/0164062 A1 | 7/2010 | Wang et al. |
| 2010/0167534 A1 | 7/2010 | Iwata |
| 2010/0193964 A1 | 8/2010 | Farooq et al. |
| 2010/0225006 A1 | 9/2010 | Haba et al. |
| 2010/0230795 A1* | 9/2010 | Kriman et al. ........... 257/686 |
| 2010/0258917 A1* | 10/2010 | Lin ...................... 257/621 |
| 2011/0089573 A1* | 4/2011 | Kurita ................... 257/774 |
| 2011/0266674 A1 | 11/2011 | Hsia et al. |
| 2012/0018863 A1 | 1/2012 | Oganesian et al. |
| 2012/0018868 A1 | 1/2012 | Oganesian et al. |
| 2012/0018893 A1 | 1/2012 | Oganesian et al. |
| 2012/0018894 A1 | 1/2012 | Oganesian et al. |
| 2012/0018895 A1 | 1/2012 | Oganesian et al. |
| 2012/0068330 A1* | 3/2012 | Oganesian et al. ........ 257/698 |
| 2012/0068352 A1 | 3/2012 | Oganesian et al. |

FOREIGN PATENT DOCUMENTS

| | | |
|---|---|---|
| EP | 1482553 A2 | 12/2004 |
| EP | 1519410 A1 | 3/2005 |
| EP | 1551060 A1 | 7/2005 |
| EP | 1619722 A1 | 1/2006 |
| EP | 1653510 A2 | 5/2006 |
| EP | 1653521 A1 | 5/2006 |
| EP | 1686627 A1 | 8/2006 |
| JP | 60160645 A | 8/1985 |
| JP | 1106949 A | 4/1989 |
| JP | 4365558 A | 12/1992 |
| JP | 11016949 A | 1/1999 |
| JP | 11195706 A | 7/1999 |
| JP | 2001085559 A | 3/2001 |
| JP | 2001-217386 A | 8/2001 |
| JP | 2002162212 A | 6/2002 |
| JP | 2002217331 A | 8/2002 |
| JP | 2002373957 A | 12/2002 |
| JP | 2003318178 A | 11/2003 |
| JP | 2004165602 A | 6/2004 |
| JP | 2004200547 A | 7/2004 |
| JP | 2005026405 A | 1/2005 |
| JP | 2005093486 A | 4/2005 |
| JP | 2005101268 A | 4/2005 |
| JP | 2007053149 A | 3/2007 |
| JP | 2007157844 A | 6/2007 |
| JP | 2007317887 A | 12/2007 |
| JP | 2008-091632 A | 4/2008 |
| JP | 2008-177249 A | 7/2008 |
| JP | 2008227335 A | 9/2008 |
| JP | 2008-258258 A | 10/2008 |
| JP | 2010-028601 A | 2/2010 |
| KR | 19990088037 | 12/1999 |
| KR | 20040066018 A | 7/2004 |
| KR | 20060009407 A | 1/2006 |
| KR | 2006-0020822 A | 3/2006 |
| KR | 20070065241 A | 6/2007 |
| KR | 100750741 B1 | 8/2007 |
| KR | 20100087566 A | 8/2010 |
| TW | 200406884 A | 5/2004 |
| TW | 200522274 A | 7/2005 |
| TW | 200535435 A | 11/2005 |
| WO | 03/025998 A2 | 3/2003 |
| WO | 2004114397 | 12/2004 |
| WO | 2008/054660 A2 | 5/2008 |
| WO | 2009017758 A2 | 2/2009 |
| WO | 2009023462 A1 | 2/2009 |
| WO | 2009104668 A1 | 8/2009 |
| WO | 2010104637 A1 | 9/2010 |

OTHER PUBLICATIONS

International Search Report and Written Opinion, PCT/US2011/063025, Mar. 19, 2012.
U.S. Appl. No. 11/590,616, filed Oct. 31, 2006.
U.S. Appl. No. 11/789,694, filed Apr. 25, 2007.
U.S. Appl. No. 12/143,743, "Recontituted Wafer Level Stacking", filed Jun. 20, 2008.
International Search Report and Written Opinion for Application No. PCT/US2011/029394 dated Jun. 6, 2012.
International Search Report and Written Opinion for Application No. PCT/US2011/060553 dated Oct. 26, 2012.
International Search Report and Written Opinion for Application No. PCT/US2011/063653 dated Aug. 13, 2012.
International Search Report and Written Opinion for PCT/US2011/051552 dated Apr. 11, 2012.
International Search Report and Written Opinion for PCT/US2011/051556 dated Feb. 13, 2012.
International Search Report and Written Opinion, PCT/US2008/009356 dated Feb. 19, 2009.
International Search Report and Written Opinion, PCT/US2010/002318, dated Nov. 22, 2010.
International Search Report and Written Opinion, PCT/US2010/052458, dated Jan. 31, 2011.
International Search Report and Written Opinion, PCT/US2010/052785, Dated Dec. 20, 2010.
International Search Report Application No. PCT/US2011/029568, dated Aug. 30, 2011.
International Search Report Application No. PCT/US2011/029568, dated Oct. 21, 2011.
International Search Report, PCT/US10/52783, Dated Dec. 10, 2010.
International Search Report, PCT/US2008/002659, Oct. 17, 2008.
International Searching Authority, Search Report for Application No. PCT/US2011/060553 dated Jun. 27, 2012.
International Written Opinion for Application No. PCT/US2011/063653 dated Jan. 14, 2013.
Japanese Office Action for Application No. 2009-552696 dated Aug. 14, 2012.
Japanese Office Action for Application No. 2010-519953 dated Oct. 19, 2012.
Partial International Search Report for Application No. PCT/US2011/063653 dated Jul. 9, 2012.
Partial International Search Report, PCT/US2008/002659.
PCT/US08/09207, "Reconstituted Wafer Stack Packaging With After Applied Pad Extensions," filed Jul. 25, 2008.
Supplementary European Search Report, EP 08795005 dated Jul. 5, 2010.
Taiwan Office Action for Application No. 100113585 dated Jun. 5, 2012.
U.S. Appl. No. 12/723,039.
U.S. Appl. No. 12/784,841.
U.S. Appl. No. 12/842,612.
U.S. Appl. No. 12/842,651.
U.S. Appl. No. 12/842,717.

* cited by examiner

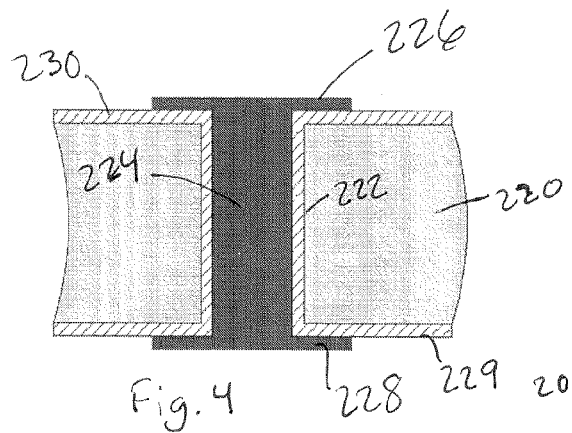
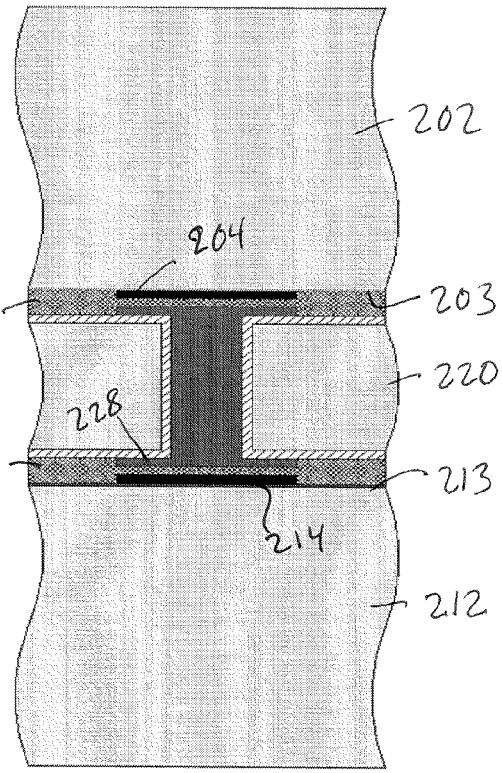
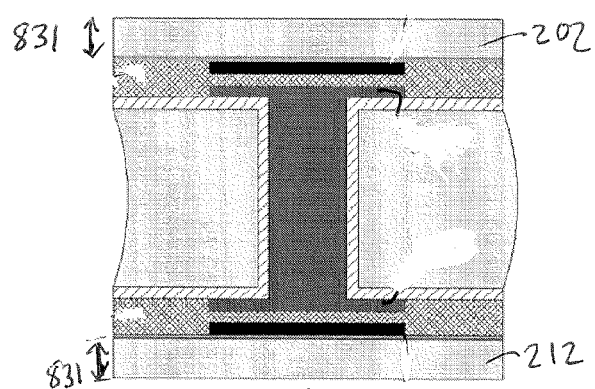
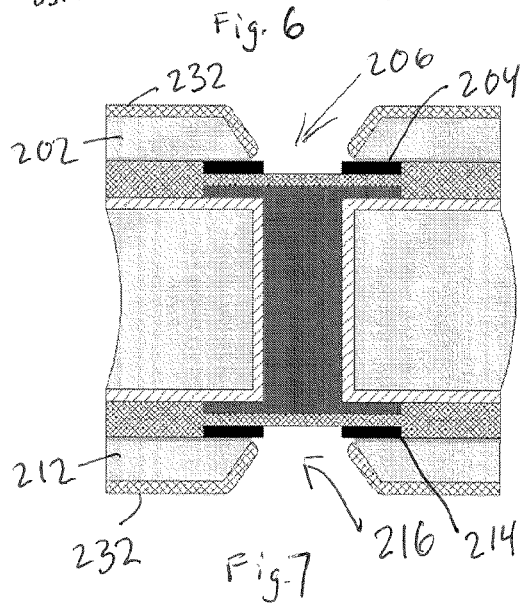
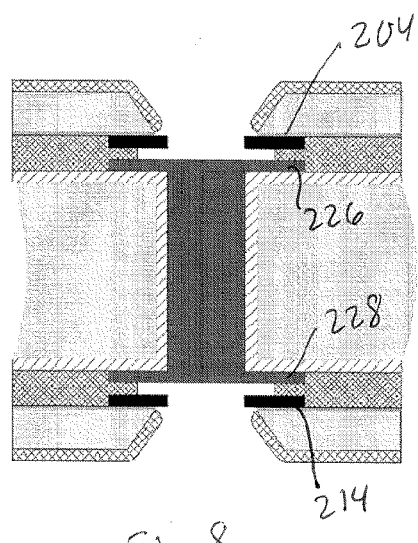

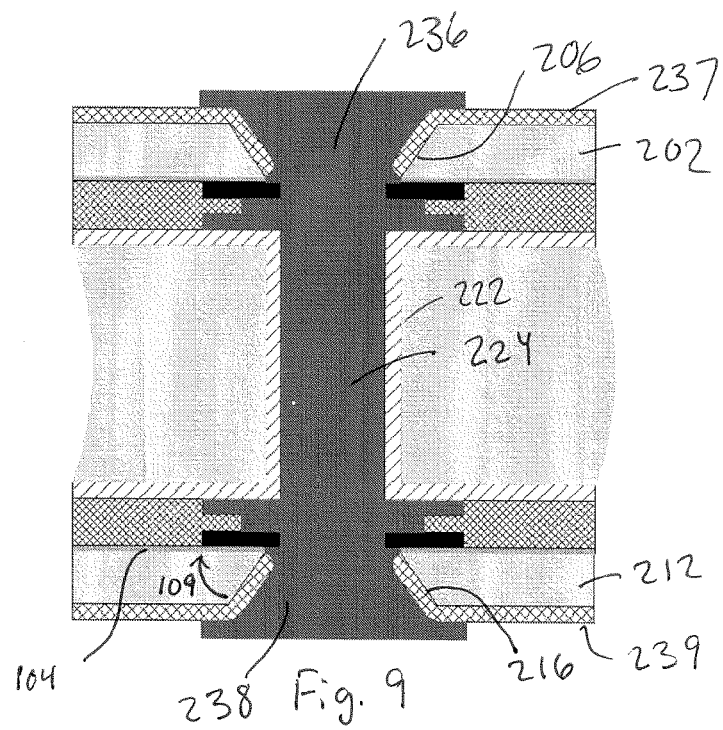
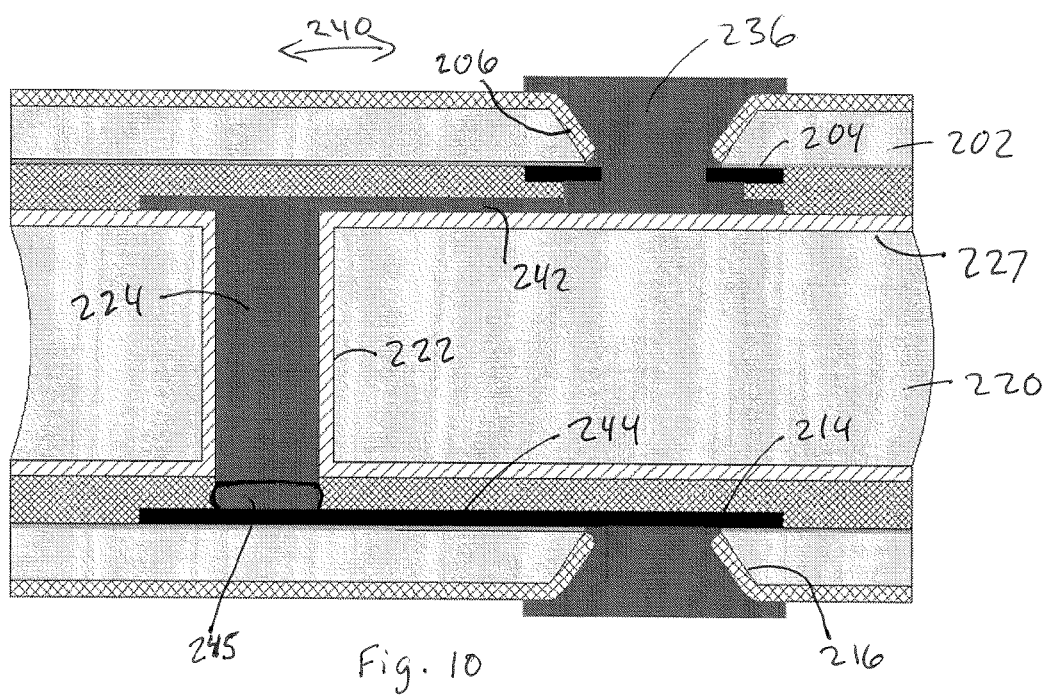

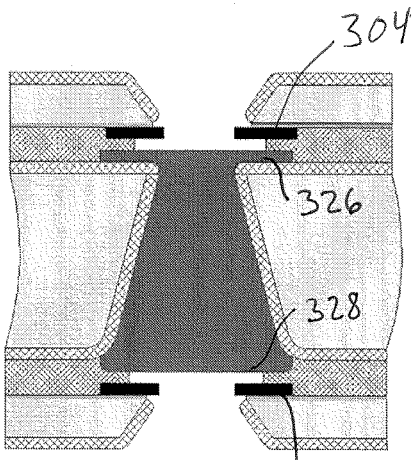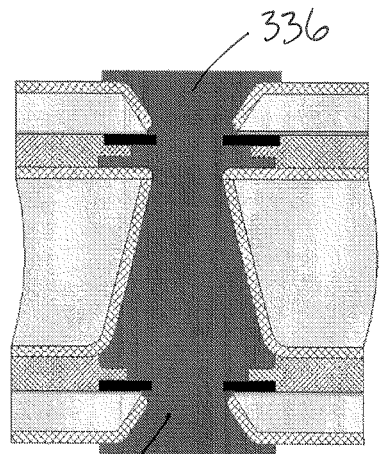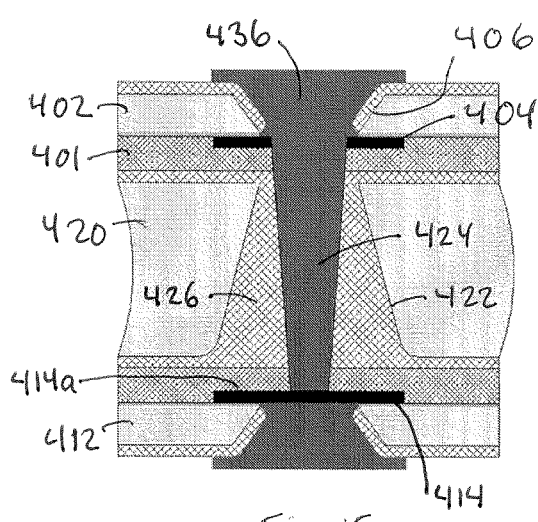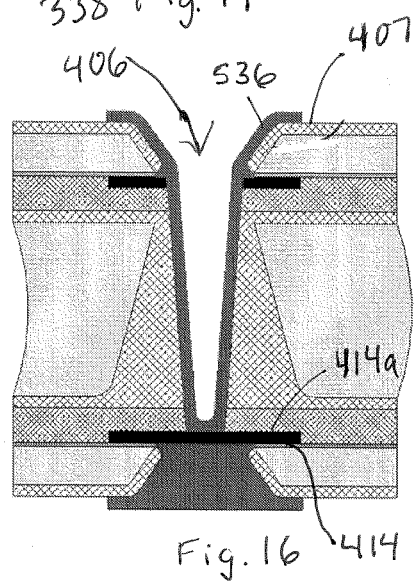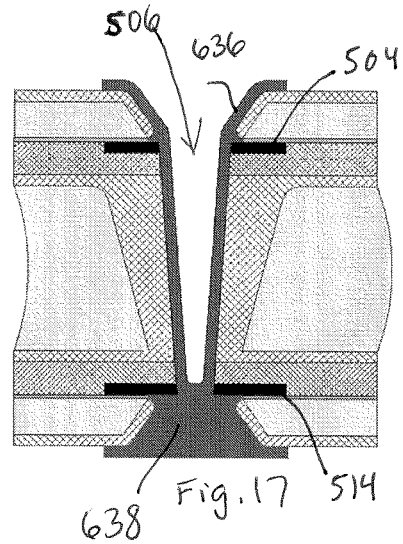

STACKED MICROELECTRONIC ASSEMBLY HAVING INTERPOSER CONNECTING ACTIVE CHIPS

BACKGROUND OF THE INVENTION

The present invention relates to packaging of microelectronic devices, especially the packaging of semiconductor devices.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 micron (μm) thick. The bond pads could include a single layer or multiple layers of metal. The size of the bond pads will vary with the device type but will typically measure tens to hundreds of microns on a side.

Through-silicon vias (TSVs) can be used to provide electrical connections between the front surface of a semiconductor chip on which bond pads are disposed, and a rear surface of a semiconductor chip opposite the front surface. Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection, further improvements can be made to enhance the processes for making connections between front and rear chip surfaces, and to the structures which can result from such processes.

SUMMARY OF THE INVENTION

According to an aspect of the invention, a microelectronic assembly is provided which includes a first microelectronic element and a second microelectronic element. Each of the microelectronic elements can embody active semiconductor devices adjacent a front surface thereof. Each microelectronic element can have a rear surface remote from the respective front surface, and each having an electrically conductive pad exposed at the respective front surface.

The microelectronic assembly can further include an interposer of a material having a coefficient of thermal expansion ("CTE") less than 10. The interposer can have oppositely facing first and second surfaces and a second conductive element extending within an opening in the interposer and being exposed at the first and second surfaces. The first surface may face the front surface of the first microelectronic element, and the second surface may face the front surface of the second microelectronic element. The microelectronic assembly may further include first and second conductive elements, each extending within an opening extending from the rear surface of a respective microelectronic element of the first and second microelectronic elements towards the front surface of the respective microelectronic element. In one embodiment, at least one of the first or second conductive elements extends through the respective first or second pad. First conductive elements may contact exposed portions of the second conductive element to provide electrical connection therewith.

In accordance with another aspect of the invention, a method is provided for fabricating a microelectronic assembly. Such method can include assembling a first microelectronic element and a second microelectronic element with an interposer therebetween, wherein each of the microelectronic elements embodies active semiconductor devices adjacent a front surface thereof, has a rear surface remote from the respective front surface, and has an electrically conductive pad exposed at the front surface. The interposer can consist essentially of a material having a coefficient of thermal expansion of less than 10 parts per million/° C., such as semiconductor or inorganic dielectric material, for example. The interposer may have oppositely facing first and second surfaces and a second conductive element extending through the substrate and being exposed at the first and second surfaces, such that the first surface faces the front surface of the first microelectronic element, and the second surface faces the front surface of the second microelectronic element. First conductive elements can then be formed which extend within openings extending from rear faces of the microelectronic elements towards the respective front face. At least one of the first conductive elements can extend through the respective conductive pad of at least one of the microelectronic elements. The first conductive elements can contact exposed portions of the second conductive element to provide electrical connection therewith. Interior surfaces of the openings in the microelectronic elements can extend in first and second directions relative to the respective first surface of each microelectronic element to define a substantial angle.

SUMMARY OF THE INVENTION

A microelectronic assembly can include first and second microelectronic elements each embodying active semiconductor devices adjacent a front surface thereof, and each having an electrically conductive pad exposed at the respective front surface. An interposer of material having a CTE less than 10 ppm/° C. has first and second surfaces attached to the front surfaces of the respective first and second microelectronic elements, the interposer having a second conductive element extending within an opening in the interposer. First and second conductive elements extend within openings extending from the rear surface of a respective microelectronic element of the first and second microelectronic elements towards the front surface of the respective microelectronic element. In one example, one or more of the first or second conductive elements extends through the respective first or second pad, and the conductive elements contact the exposed portions of the second conductive element to provide electrical connection therewith.

In one or more particular embodiments, the opening through which the second conductive element extends intersects with at least one of the openings extending through the first and second microelectronic elements.

In one or more particular embodiments, the opening through which the second conductive element extends intersects with each of the openings extending through the first and second microelectronic elements.

In one or more particular embodiments, the opening through which the second conductive element extends does not intersect with either of the openings extending through the first and second microelectronic elements.

In one or more particular embodiments, the interposer consists essentially of dielectric material.

In one or more particular embodiments, the interposer consists essentially of metal or semiconductor material, wherein the opening in the interposer is lined with an insulator.

In one or more particular embodiments, the second conductive element includes second electrically conductive pads exposed at the first and second surfaces, the pads of the first and second microelectronic elements being first pads, the first pads being juxtaposed with the second pads, and the first conductive elements contacting juxtaposed surfaces of the first and second pads.

In one or more particular embodiments, an opening through the second microelectronic element through which the second conductive element extends has an interior wall extending at a normal angle relative to the first and second surfaces of the interposer.

In one or more particular embodiments, an opening in the interposer through which the second conductive element extends tapers in a direction between the first and second surfaces of the interposer.

In one or more particular embodiments, the opening in the first microelectronic element tapers in a direction from the rear surface of the first microelectronic element towards the front surface thereof.

In one or more particular embodiments, the opening in the first microelectronic element tapers in a direction from the rear surface of the first microelectronic element towards the front surface thereof.

In one or more particular embodiments, an interior surface of the opening in the first microelectronic element extends at a normal angle to the front surface of the first microelectronic element.

In one or more particular embodiments, an interior surface of the opening in the first microelectronic element extends at a normal angle to the front surface of the first microelectronic element.

In one or more particular embodiments, the second conductive element conforms to a contour of an interior surface of the opening in the interposer.

In one or more particular embodiments, the second conductive element does not conform to a contour of an interior surface of the opening in the interposer.

In one or more particular embodiments, the opening in the interposer and the opening in at least one of the first or second microelectronic elements are tapered, becoming smaller in opposite directions from one another.

In one or more particular embodiments, the interposer further includes at least one passive component electrically connected with at least one of the first or second microelectronic elements.

In one or more particular embodiments, a system can include a structure according to one or more of the embodiments described herein, together with one or more other electronic components electrically connected to the structure.

In one or more particular embodiments, the system can include a housing, said structure and said other electronic components being mounted to said housing.

In accordance with an embodiment of the invention, a method is provided for fabricating a microelectronic assembly. Such method can include assembling a first microelectronic element and a second microelectronic element with an interposer therebetween. Each of the microelectronic elements can embody active semiconductor devices adjacent a front surface thereof, and can have a rear surface remote from the respective front surface, and an electrically conductive pad exposed at the front surface. The interposer may consist essentially of a material having a CTE of less than 10 ppm/° C. such as a material consisting essentially of a dielectric or semiconductor material or a metal. The interposer can have oppositely facing first and second surfaces and a second conductive element extending through the substrate and exposed at the first and second surfaces. The first surface of the interposer may face the front surface of the first microelectronic element, and the second surface can face the front surface of the second microelectronic element. First conductive elements can be formed which extend within openings extending from rear faces of the microelectronic elements towards the respective front face. In one example, at least one of the first conductive elements can extend through the respective conductive pad of at least one of the microelectronic elements. The first conductive elements can contact exposed portions of the second conductive element to provide electrical connection therewith. In a particular case, interior surfaces of the openings in the microelectronic elements extend in first and second directions relative to the respective first surface of each microelectronic element to define a substantial angle.

In one or more particular embodiments, each of the microelectronic elements has a first conductive element extending within an opening extending from the respective rear surface through the respective conductive pad.

In one or more particular embodiments, the second conductive element includes second electrically conductive pads exposed at the first and second surfaces, the first conductive pad of each microelectronic element is juxtaposed with one of the second pads, and the first conductive elements contact juxtaposed surfaces of the first and second pads.

In one or more particular embodiments, an opening through the second microelectronic element through which the second conductive element extends has an interior wall extending at a normal angle relative to the first and second surfaces of the interposer.

In one or more particular embodiments, an opening in the interposer through which the second conductive element extends tapers in a direction between the first and second surfaces of the interposer.

In one or more particular embodiments, the second conductive element conforms to a contour of an interior surface of the opening in the interposer.

In one or more particular embodiments, the second conductive element does not conform to a contour of an interior surface of the opening in the interposer.

In one or more particular embodiments, the opening in the interposer and the second conductive element are tapered in opposite directions.

BRIEF DESCRIPTION OF THE DRAWINGS

FIGS. 4, 5, 6, 7, 8, 9, 10 and 11 are fragmentary sectional views illustrating stages in a method of fabricating a microelectronic assembly according to a variation of the embodiment of the invention.

FIGS. 12, 13 and 14 are fragmentary sectional views illustrating stages in a method of fabricating a microelectronic assembly according to a variation of the embodiment of the invention shown in FIGS. 4, 5, 6, 7, 8, 9, 10 and 11.

FIGS. 15 and 16 are fragmentary sectional views illustrating stages in a method of fabricating a microelectronic assembly according to a variation of the embodiment of the invention shown in FIGS. 12, 13 and 14.

FIG. 17 is a fragmentary sectional view illustrating a microelectronic assembly according to a variation of the embodiment of the invention shown in FIG. 16.

DETAILED DESCRIPTION

Figure 1:
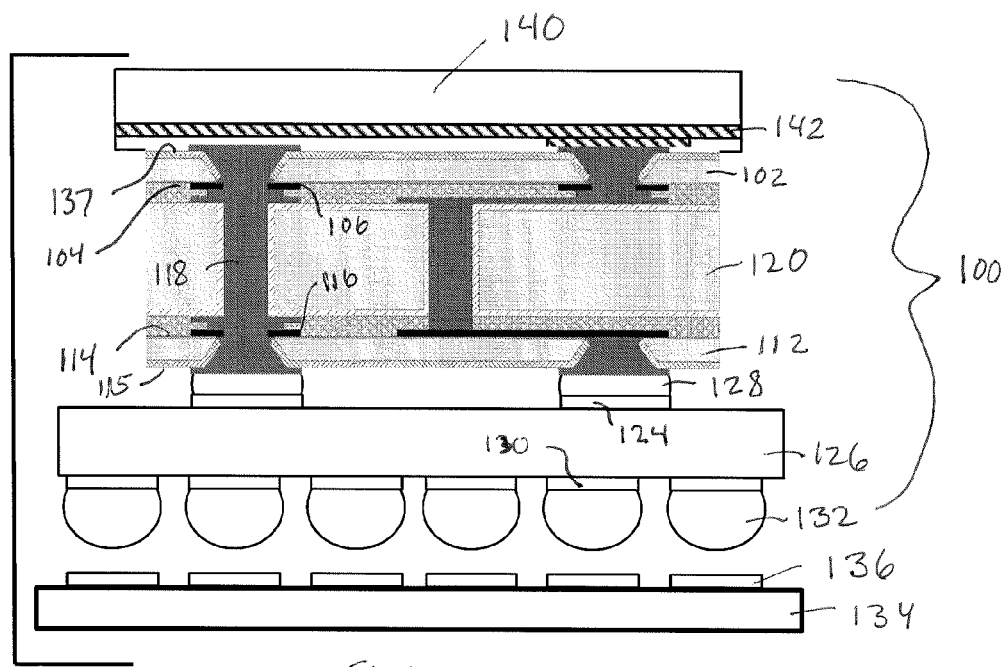
FIG. 1 is a sectional view illustrating a microelectronic assembly in accordance with an embodiment of the invention, positioned for attachment with a circuit panel.
Figure 1A:
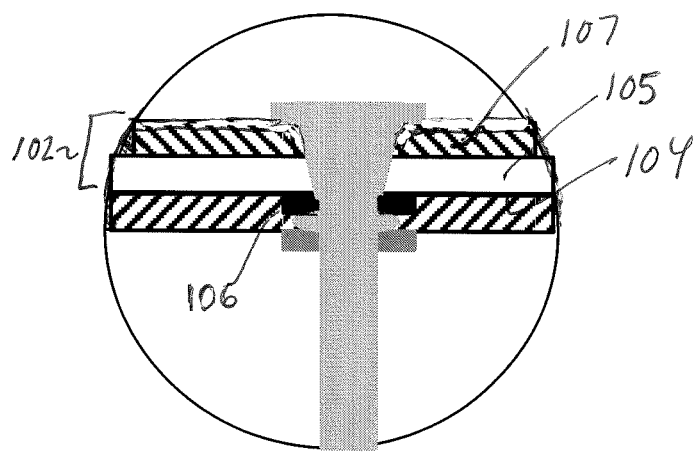
FIG. 1A is a fragmentary sectional view further illustrating in detail a microelectronic assembly in accordance with an embodiment of the invention.

FIG. 1 illustrates a microelectronic assembly 100 in accordance with an embodiment of the invention. The microelectronic package includes first and second microelectronic elements 102, 112, each having a contact-bearing front surface 104, 114 which faces toward an interposer 120 disposed between the microelectronic elements. Each microelectronic element can be, for example, an integrated circuit embodied in a semiconductor chip, which can include silicon, an alloy of silicon, or other semiconductor material such as a III-V semiconductor material or II-VI semiconductor material. As seen in the enlarged view of FIG. 1A, chip 102 has a front surface 104, also referred to as a contact-bearing face, being a major surface of the chip, with a first region 105 of the chip at the front face. The second chip 112 can have the same structure as chip 102. The first region 105 includes a dielectric region, which typically includes a plurality of wiring layers having dielectric layers disposed between and around the wiring layers. In a particular embodiment, the dielectric region can include one or more layers of dielectric material having a low dielectric constant, i.e., a "low-k" dielectric layer. Low-k dielectric materials include porous silicon dioxide, carbon-doped silicon dioxide, polymeric dielectrics, and porous polymeric dielectrics, among others. In a porous low-k dielectric layer, the dielectric layer can have substantial porosity, which reduces the dielectric constant of the dielectric material relative to a nonporous layer of the same material. Dielectric materials typically have a dielectric constant significantly above 1.0, but air which occupies open spaces within a porous dielectric material has a dielectric constant of about 1.0. In this way, some dielectric materials can achieve reductions in the dielectric constant by having substantial porosity.

However, some low-k dielectric materials, such as polymeric dielectric materials and porous dielectric materials, withstand much less mechanical stress than traditional dielectric materials. Particular types of operating environments and ways that the microelectronic element may be tested can present stress at or near a limit that the low-k dielectric material can tolerate. The microelectronic assemblies described herein provide improved protection for the low-k dielectric layer of a microelectronic element by moving the locations where stress is applied to the microelectronic element away from the low-k dielectric layer within region 105. In this way, manufacturing, operation and testing apply much reduced stresses to the low-k dielectric layer, thus protecting the low-k dielectric layer.

Layer 105 also includes active semiconductor devices (e.g., transistors, diodes, or other active devices), which are ultimately connected by the wiring layers with a plurality of electrically conductive pads 106 at the front face. When the chip is a silicon-on-insulator ("SOI") type chip, the first region 105 may also include a buried dielectric layer which underlies the active semiconductor devices. The first region 105 may separate a second region 107 of the chip from the front face 104. The first region typically has a thickness of 0.1 micron to 5 microns, and typically cannot be thinned. The second region 107 typically consists essentially of semiconductor material (typically either monocrystalline or polycrystalline) and typically has a thickness under 20 microns, the thickness typically being determined by the degree to which an initial semiconductor wafer has been thinned during processing. In one embodiment, the chip may have only the first region 105 and the second region 107 may not be present. Thus, the structurally interposer 120 to which the microelectronic elements 102, 112 are mounted, structurally supports the microelectronic elements, enabling the thicknesses of the microelectronic elements 102, 112 to be reduced to an exceptional degree. Also, with the dielectric region 105 the of each microelectronic element facing the interposer.

As further shown in FIG. 1, the microelectronic elements can be bonded together with the interposer 120, such as with adhesive 101. Other possible bonding materials can include glass, which in a particular embodiment, can be doped and can have a glass transition temperature below 500° C. Typically, microelectronic element 112 consists essentially of the same semiconductor material as the other microelectronic element 102. As further seen in FIG. 1, microelectronic element 110 can have a plurality of conductive via elements extending through openings in the microelectronic element for providing electrically conductive connections with the conductive pads 106, 116.

The microelectronic elements 102, 112, can be electrically connected together through electrically conductive elements 118 extending through the conductive pads 106, 116 and the interposer 120 therebetween. In one example, the conductive elements 118 can include metal features which are formed by depositing a metal in contact with exposed surfaces of the conductive pads 106, 116. Various metal deposition steps can be used to form the conductive elements, as described in further detail below.

Figure 2:
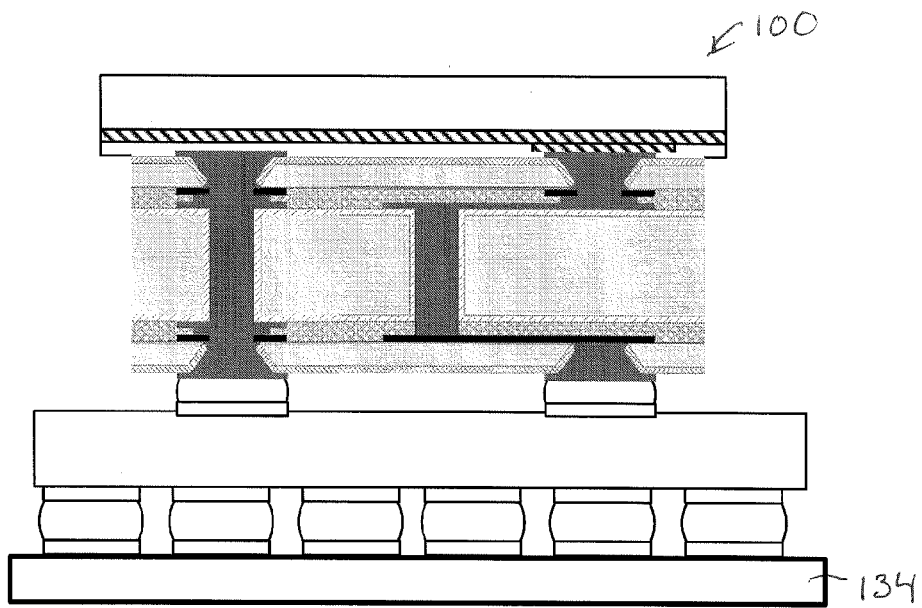
FIG. 2 is a sectional view illustrating a microelectronic assembly in accordance with an embodiment of the invention, as mounted to a circuit panel.

As further seen in FIG. 1, the conductive elements 118 can be conductively bonded, similar to flip-chip manner, to contacts 124 exposed at a surface of a dielectric element 126, such as through masses 128 of a bond metal, e.g., solder, tin, indium, or a combination thereof. In turn, the dielectric element can have a plurality of terminals 130 for further electrically connecting the package 100 to corresponding contacts 136 of a circuit panel 134, such as through conductive masses 132, e.g., solder balls, projecting away from the dielectric element 126. FIG. 1 illustrates the package 100 prior to joining the circuit panel 134 thereto. FIG. 2 illustrates a microelectronic assembly which includes the package 100 and the circuit panel 134 joined thereto.

A heat spreader 140 may be thermally coupled to a rear surface 137 of microelectronic element 102, such as through a thermally conductive material 142, e.g., a thermally conductive grease, thermally conductive adhesive, or a joining metal having a relatively low melting temperature such as solder, tin, indium, gold, or other material. When the thermally conductive material 142 is also electrically conductive, such as a metal or conductive compound of a metal, a dielectric layer (not shown) can separate the rear surface 137 of the microelectronic element 102 from such thermally and electrically conductive material 142. As discussed above, the microelectronic assembly or package 100 enables the thicknesses of the microelectronic elements 102, 112 to be reduced to an exceptional degree. In this way, the thickness of each microelectronic element 102 or 112 may be only the thickness of the first region 105 (FIG. 1A) or such thickness plus a small thickness of a second region 107. The reduced thickness can enable remarkably effective and even heat transfer to be achieved with heat spreader 140.

Figure 3:
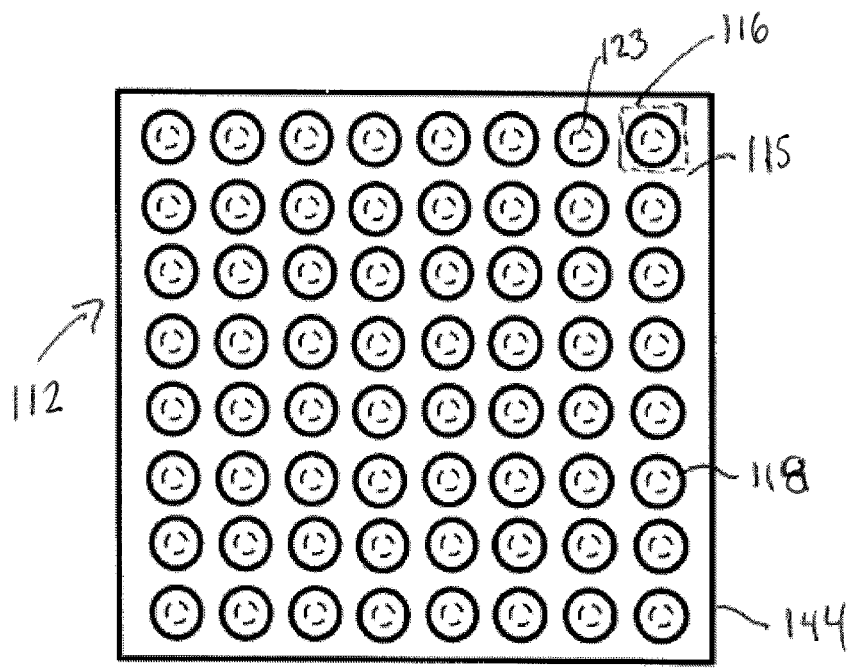
FIG. 3 is plan view further illustrating a microelectronic assembly in accordance with an embodiment of the invention.

FIG. 3 is a view looking toward the rear surface 115 of the microelectronic element 112 of the package illustrating conductive elements 118 exposed at the rear surface, which are shown arranged in an area array. As also shown in FIG. 3, the conductive elements 118 extend within second openings 123 and are connected to conductive pads 116 exposed at the front surface 103 (FIG. 1) of microelectronic element 110, which can also be arranged in an area array. Alternatively, when the conductive pads 116 of microelectronic element have a different arrangement, such as can be arranged adjacent peripheral edges 144, or can be arranged centrally to the front surface, the conductive elements 118 typically have a matching pattern.

Referring now to FIG. 4, a fabrication method will now be described for making a microelectronic assembly according to another embodiment of the invention. FIG. 4 is a fragmentary sectional view showing an interposer 220 having a through hole 222 through which a conductive via 224 extends. The via 224 can terminate in first and second conductive pads 226, 228 exposed at first and second major surfaces 227, 229 of the interposer, respectively.

The interposer may have a linear coefficient of thermal expansion (CTE-α) which is less than about 10 parts per million per degree Celsius, i.e., "less than 10 ppm/° C.". The CTE-α of silicon, silicon dioxide, some ceramic materials and some metals, among others, is within this range. When the interposer is made of metal or semiconductor material, a dielectric layer 230 can overlie the first and second major surfaces and line the through hole 222 for insulating the via 224 and pads 226, 228 from the body of the interposer 220. Then, as illustrated in FIG. 5, a first wafer 202 and a second wafer 212 are attached to the interposer with the front surfaces 203, 213 of the wafers facing the first and second interposer surfaces 227, 229, respectively. An adhesive or other dielectric material 201, e.g., glass, can be used for attaching the interposer with the wafers. Typically, the wafers are attached to the interposer such that conductive pads of each wafer are juxtaposed with the pads of the interposer. For example, a conductive pad 204 of first wafer 202 is juxtaposed with interposer pad 226 and a conductive pad 214 of second wafer 212 is juxtaposed with interposer pad 228.

Next, as seen in FIG. 6, thicknesses of the wafers are reduced, such as by grinding, lapping or polishing, as described above. After completing this step, each wafer 202, 212 may have a thickness 231 which corresponds to the thickness of the non-thinnable region 105 (FIG. 1A) as described above, or may have a greater thickness which may include some material of region 107 (FIG. 1A) underlying the non-thinnable region. In one embodiment, region 107 of one or both wafers 202, 212 may have a thickness of up to 20 microns.

FIG. 7 illustrates a subsequent stage of processing after which first and second openings 206, 216 have been formed which extend through the thickness of each wafer including the conductive pads 204, 214 thereon. Such openings can be made by etching, laser patterning, sandblasting, mechanical milling, or other technique applied to the semiconductor material of each wafer, for example. After forming the openings extending through the wafer thickness, dielectric layers 232 can be formed on interior walls of the openings, after which the openings can be extended through the respective pads 204, 214. The process of forming the openings 206, 216 and the dielectric layers 232 can be as generally described in any or all of United States Patent Publication No. 20080246136A1, or United States applications, each filed Jul. 23, 2010: application Ser. Nos. 12/842,717, 12/842,612, 12/842,669; 12/842,692; 12/842,587, the disclosures of which are incorporated herein by reference. In one embodiment, the dielectric layers 232 can be formed selectively onto exposed semiconductive or conductive surfaces within the openings 206, 216 and on the exposed faces of the microelectronic elements by electrophoretic or electrolytic deposition.

FIG. 8 illustrates an optional step in which portions of a dielectric or bonding material between the juxtaposed surfaces of the wafer pads 204, 214 and the interposer pads 226, 228, respectively, are removed.

Then, as shown in FIG. 9, one or more layers of metal can be deposited into the openings 206, 216 to form conductive elements 236, 238 which are exposed at respective outwardly facing surfaces 237, 239 of the microelectronic assembly. The conductive elements 236, 238 contact the conductive pads 204, 214 of the respective wafers 02, 212 and are electrically coupled together through the interposer pads 226, 228 and via 224 extending through the interposer.

In the embodiment seen in FIG. 9, the opening 222 through which the via 224 extends intersects the openings 206, 216 extending through the first and second wafers 202, 212. However, other arrangements are possible. For example, as seen in FIG. 10, the conductive elements in one or both of the wafers 202, 212 can be displaced in one or more lateral directions 240 (a direction in which interposer major surface 227 extends) from the via 224. In the case shown in FIG. 10, both conductive elements 236, 238 can be displaced from the via in the same direction, and neither of the openings 206, 216 in which the conductive elements are formed intersects the corresponding interposer opening 222 through which via 224 extends and electrically connects the conductive elements 236, 238. As seen in FIG. 9, interior surfaces of the openings 216, 206 in the microelectronic elements 202, 212 can extend in first and second directions relative to the respective first surface 104 of each microelectronic element to define a substantial angle 109.

As further seen in FIG. 10, electrical connection between the interposer via 224 and the pads 204, 214 can be provided in one or more ways. For example, a microelectronic element 212 can have a trace 244 extending away from conductive pad 214 towards the interposer 220 and the trace 244 can be conductively bonded to the via 224 of interposer, such as by using a joining metal 245 such as solder, tin or indium, diffusion bonding, or alternatively by direct metal to metal joining under heat and pressure. In another example, the interposer 220 can have an electrically conductive trace 242 which extends away from the via 224 in a direction 240 in which the first major surface 227 of the interposer extends. In this case, the fabrication of conductive element 236 forms an electrical connection between the pad 204 of first wafer and the trace 242 of the interposer.

Figure 11:
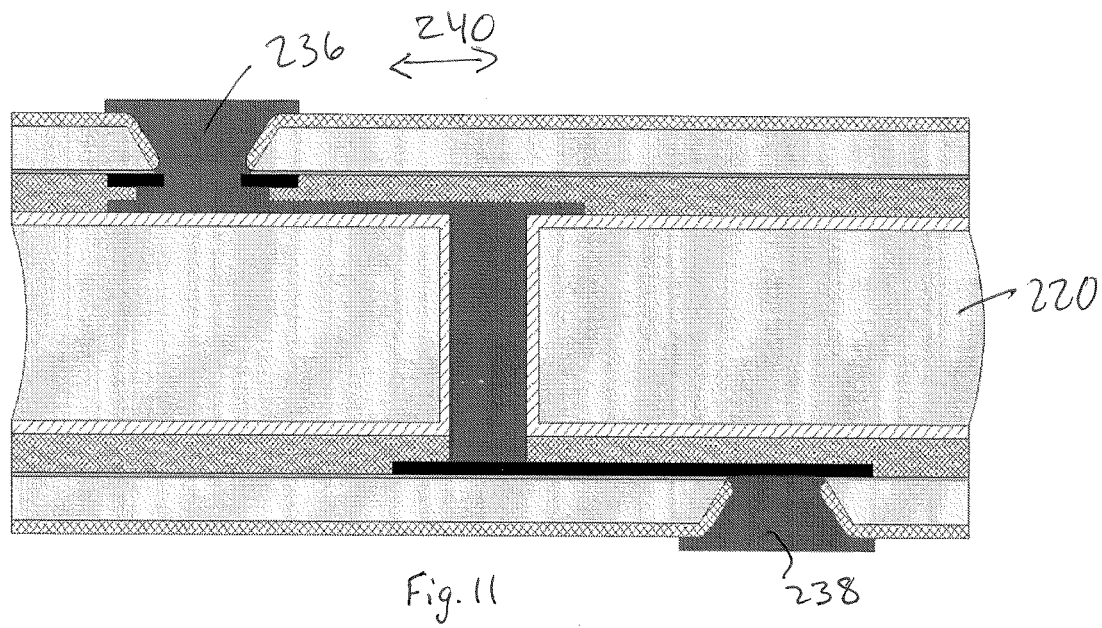

FIG. 11 illustrates another example in which conductive elements 236, 238 are displaced from one another in a direction 240.

Figure 12:
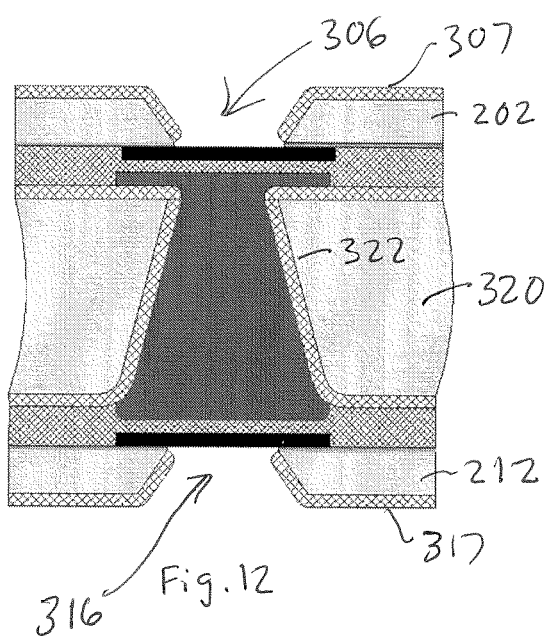

Referring now to FIG. 12, a further variation is shown in which the opening 322 in the interposer 320 is tapered such that its width becomes smaller in a direction towards the front surface of one of the microelectronic elements 202. After forming the openings 306, 316 in the microelectronic elements 202, 212, dielectric layers 307, 317 can be formed on walls of the openings and the first surfaces. Thereafter, as seen in FIG. 13, portions of the dielectric material, e.g., adhesive, between juxtaposed surfaces of the conductive pads 304, 314 and the corresponding bonding surfaces 326, 328 of the interposer via can be removed. FIG. 14 illustrates the microelectronic assembly after the conductive elements 336, 338 have been formed in contact with corresponding surfaces of the interposer via, wherein the deposited conductive material, e.g., deposited metal, fills the spaces between surfaces of the conductive pads 304, 314 and corresponding surfaces 326, 328 of the interposer via which are juxtaposed therewith.

FIG. 15 illustrates a further variation in which the conductive element 424 extending through the interposer opening has a shape, e.g., frusto-conical shape, which does not conform to a contour of the interior surface of the interposer opening 422. A fabrication method of the structure shown in FIG. 15 may also vary from that described above (FIGS. 4-14). In this case, when the interposer 420 is joined with the microelectronic elements 402, 412, the interposer can have an opening 422 extending between first and second major surfaces which is filled with a dielectric material 426. When the opening 406 is formed in microelectronic element 402 and the conductive pad 404 thereon, the material removal process is continued through the adhesive or bonding layer 401 and through the region of dielectric material 426 until an upper surface 414a of conductive pad 414 is exposed within the opening 406. Thereafter, the opening 406 can be filled with one or more layers or metal or conductive compound of a metal to form the conductive element 436 extending through microelectronic element 402 and interposer 420.

FIG. 16 illustrates a variation of the structure shown in FIG. 15, in which the conductive element 536 is formed as a hollow structure lining an interior surface of a dielectric layer 407 within the opening 406 but not filling the opening. The conductive element 536 contacts an upper surface 414a of a conductive pad 414 exposed within the opening 406. FIG. 17 illustrates a further variation in which the opening 506 extends through a thickness of both conductive pads 504, 514, such that the conductive elements 636, 638 when formed can be in direct contact with each other.

Figure 18:
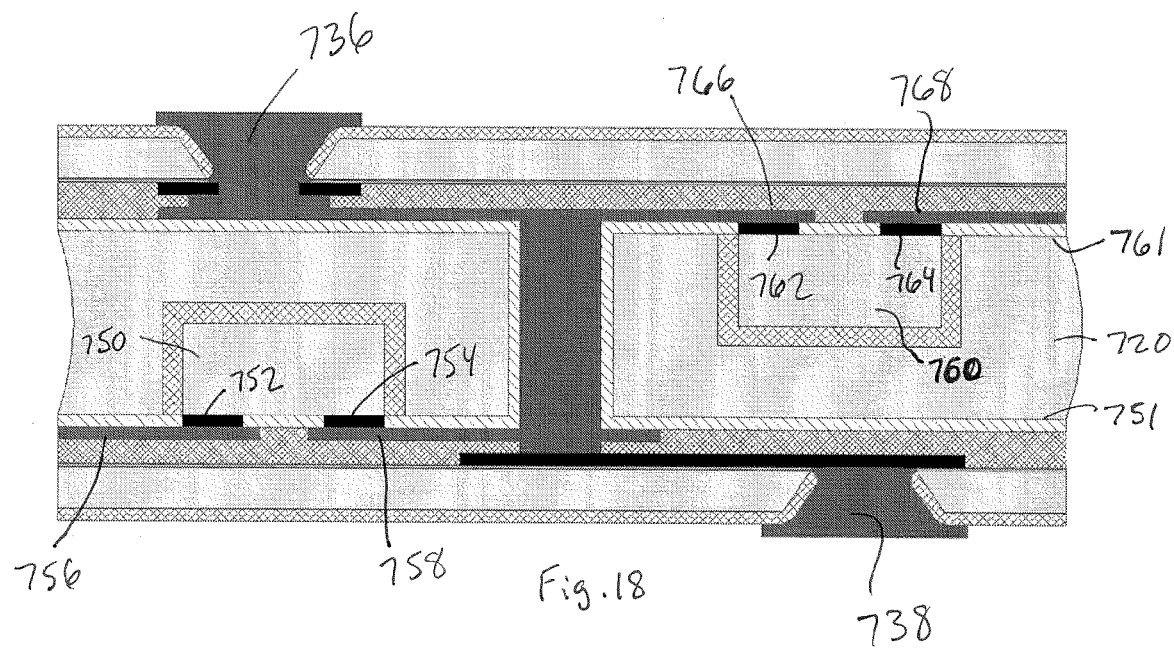
FIG. 18 is a fragmentary sectional view illustrating a microelectronic assembly according to a further variation of the embodiment of the invention shown in FIG. 10.

FIG. 18 illustrates a variation of the above-described embodiment (FIG. 11) in which the interposer 720 embodies one or more passive circuit elements. For example, the interposer can embody a first capacitor 750 having electrodes 752, 754 electrically connected with respective traces 756, 758 extending along a major surface 751 of the interposer 720. Similarly, the interposer can embody a second capacitor 760 having electrodes 762, 764 electrically connected with respective traces 766, 768 extending along major surface 761 of the interposer 720. Some of the traces 758, 766 can be connected through further conductive elements 736, 738 to conductive pads which in operation of the assembly carry a time-varying signal, while other traces 756, 768 can be connected to one or more conductive pads (not shown) which in operation of the assembly carry a reference potential such as ground or a power supply voltage.

In other variations of the embodiment seen in FIG. 18, the passive circuit elements can include one or more of: an inductor, a resistor, or other passive circuit element, being disposed as seen in FIG. 18 and having an electrical interconnection arrangement as seen, for example, in FIG. 18.

Figure 19:
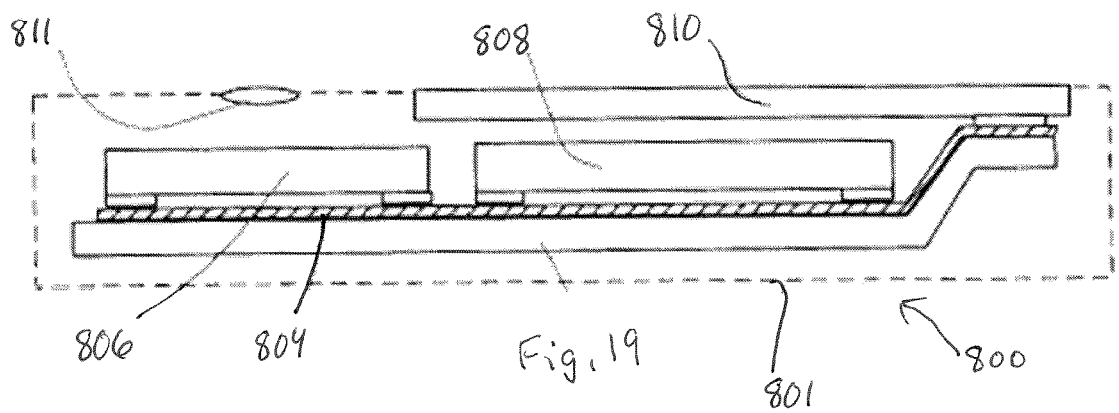
FIG. 19 is a schematic depiction of a system according to one embodiment of the invention.

The structure and fabrication of the microelectronic assemblies and incorporation thereof into higher-level assemblies can include structure, and fabrication steps which are described in one or more of the following commonly owned co-pending applications of Oganesian et al. filed on even date herewith: "STACKED MICROELECTRONIC ASSEMBLY WITH TSVS FORMED IN STAGES AND CARRIER ABOVE CHIP" (U.S. Provisional Application No. 61/419,033; and "STACKED MICROELECTRONIC ASSEMBLY WITH TSVS FORMED IN STAGES WITH PLURAL ACTIVE CHIPS" (U.S. Provisional Application No. 61/419,037, and the following U.S. applications each filed Jul. 23, 2010: application Ser. Nos. 12/842,717; 12/842,651; 12/842,612; 12/842,669; 12/842,692; and 12/842,587; the disclosures of all such applications being incorporated by reference herein. The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 800 in accordance with a further embodiment of the invention includes a structure 806 as described above in conjunction with other electronic components 808 and 810. In the example depicted, component 808 is a semiconductor chip whereas component 810 is a display screen, but any other components can be used. Of course, although only two additional components are depicted in FIG. 19 for clarity of illustration, the system may include any number of such components. The structure 806 as described above may be, for example, a microelectronic assembly 100 as discussed above in connection with FIG. 1, 9, 10, 14, 15, 16, 18. In a further variant, both may be provided, and any number of such structures may be used. Structure 806 and components 808 and 810 are mounted in a common housing 801, schematically depicted in broken lines, and are electrically interconnected with one another as necessary to form the desired circuit. In the exemplary system shown, the system includes a circuit panel 802 such as a flexible printed circuit board, and the circuit panel includes numerous conductors 804, of which only one is depicted in FIG. 19, interconnecting the components with one another. However, this is merely exemplary; any suitable structure for making electrical connections can be used. The housing 801 is depicted as a portable housing of the type usable, for example, in a cellular telephone or personal digital assistant, and screen 810 is exposed at the surface of the housing. Where structure 806 includes a light-sensitive element such as an imaging chip, a lens 811 or other optical device also may be provided for routing light to the structure. Again, the simplified system shown in FIG. 19 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention as defined by the claims.

The invention claimed is:

1. A microelectronic assembly, comprising:
a first microelectronic element and a second microelectronic element, each of the microelectronic elements embodying active semiconductor devices adjacent a front surface thereof, each microelectronic element having a rear surface remote from the respective front surface, and each having an electrically conductive pad exposed at the respective front surface;
an interposer of a material having a coefficient of thermal expansion ("CTE") less than 10 parts per million/° C., the interposer having oppositely facing first and second surfaces and a second conductive element extending within an opening in the interposer and being exposed at the first and second surfaces, the first surface facing the front surface of the first microelectronic element, and the second surface facing the front surface of the second microelectronic element;
each of the first and second microelectronic elements further including a first conductive element extending within an opening extending from the rear surface of the respective microelectronic element towards the front surface of the respective microelectronic element, wherein the first conductive element of the first microelectronic element extends through the electrically conductive pad of the first microelectronic element, and the first conductive elements are electrically coupled with the second conductive element,
wherein the first conductive element of the first microelectronic element and the second conductive element form a continuous monolithic metal region extending between the rear surface of the first microelectronic element and the second surface of the interposer, and wherein a portion of the first conductive element of the first microelectronic element has a first width in a direction parallel to the first surface, the first width being greater than a second width of an opening in the pad of the first microelectronic element.

2. The microelectronic assembly as claimed in claim 1, wherein the opening through which the second conductive element extends intersects with the opening extending through the first microelectronic element.

3. The microelectronic assembly as claimed in claim 1, wherein the opening through which the second conductive element extends intersects with each of the openings extending through the first and second microelectronic elements.

4. A microelectronic assembly, comprising:
a first microelectronic element and a second microelectronic element, each of the microelectronic elements embodying active semiconductor devices adjacent a front surface thereof, each microelectronic element having a rear surface remote from the respective front surface, and each having an electrically conductive pad exposed at the respective front surface;
an interposer of a material having a coefficient of thermal expansion ("CTE") less than 10 parts per million/° C., the interposer having oppositely facing first and second surfaces and a second conductive element extending within an opening in the interposer and being exposed at the first and second surfaces, the first surface facing the front surface of the first microelectronic element, and the second surface facing the front surface of the second microelectronic element;
each of the first and second microelectronic elements further including a first conductive element extending within an opening extending from the rear surface of the respective microelectronic element towards the front surface of the respective microelectronic element, wherein the first conductive element of the first microelectronic element extends through the electrically conductive pad of the first microelectronic element, and the first conductive elements are electrically coupled with the second conductive element,
wherein the second conductive element includes second electrically conductive pads exposed at the first and second surfaces of the interposer, the pads of the first and second microelectronic elements being first pads, the first pad of the first microelectronic element being juxtaposed with the second pad exposed at the first surface, and the first conductive element of the first microelectronic element contacting juxtaposed surfaces of the first pad of the first microelectronic element and the second pad exposed at the first surface, the first conductive element of the first microelectronic element being a first continuous monolithic metal region extending between the rear surface of the first microelectronic element and the second pad exposed at the first surface, and
wherein a portion of the first conductive element of the first microelectronic element disposed between the juxtaposed surfaces of the first pad of the first microelectronic element and the second pad exposed at the first surface has a first width in a direction parallel to the first surface, the first width being greater than a second width of an opening in the first pad of the first microelectronic element through which the first conductive element of the first microelectronic element extends.

5. The microelectronic assembly as claimed in claim 1, wherein the interposer consists essentially of dielectric material.

6. The microelectronic assembly as claimed in claim 1, wherein the interposer consists essentially of metal or semiconductor material, wherein the opening in the interposer is lined with an insulator.

7. The microelectronic assembly as claimed in claim 1, wherein the opening through the second microelectronic element through which the first conductive element of the second microelectronic element extends has an interior wall extending at a normal angle relative to the first and second surfaces of the interposer.

8. The microelectronic assembly as claimed in claim 7, wherein the opening in the first microelectronic element tapers in a direction from the rear surface of the first microelectronic element towards the front surface thereof.

9. The microelectronic assembly as claimed in claim 7, wherein an interior surface of the opening in the first microelectronic element extends at a normal angle to the front surface of the first microelectronic element.

10. The microelectronic assembly as claimed in claim 1, wherein the opening in the interposer through which the second conductive element extends tapers in a direction between the first and second surfaces of the interposer.

11. The microelectronic assembly as claimed in claim 10, wherein the opening in the first microelectronic element tapers in a direction from the rear surface of the first microelectronic element towards the front surface thereof.

12. The microelectronic assembly as claimed in claim 10, wherein an interior surface of the opening in the first microelectronic element extends at a normal angle to the front surface of the first microelectronic element.

13. The microelectronic assembly as claimed in claim 1, wherein the second conductive element conforms to a contour of an interior surface of the opening in the interposer.

14. The microelectronic assembly as claimed in claim 1, wherein the second conductive element does not conform to a contour of an interior surface of the opening in the interposer.

15. The microelectronic assembly as claimed in claim 1, wherein the opening in the interposer and the opening in at least one of the first or second microelectronic elements are tapered, becoming smaller in opposite directions from one another.

16. The microelectronic assembly as claimed in claim 1, wherein the interposer further includes at least one passive component electrically connected with at least one of the first or second microelectronic elements.

17. A system comprising a structure according to claim 1 and one or more other electronic components electrically connected to the structure.

18. A system as claimed in claim 17 further comprising a housing, said structure and said other electronic components being mounted to said housing.

19. The microelectronic assembly as claimed in claim 1, wherein the continuous monolithic metal region of the first conductive element of the first microelectronic element and the second conductive element extends from the rear surface of the first microelectronic element to the electrically conductive pad of the second microelectronic element.

20. The microelectronic assembly as claimed in claim 1, wherein the continuous monolithic metal region of the first conductive element of the first microelectronic element and the second conductive element includes the first conductive element of the second microelectronic element, and the continuous monolithic metal region extends from the rear surface of the first microelectronic element to the rear surface of the second microelectronic element.

21. The microelectronic assembly as claimed in claim 4, wherein the opening through which the second conductive element extends does not intersect with either of the openings extending through the first and second microelectronic elements.

22. The microelectronic assembly as claimed in claim 4, wherein the first pads of the second microelectronic element are juxtaposed with the second pad exposed at the second surface of the interposer, and the first conductive element of the second microelectronic element contacts juxtaposed surfaces of the first pad of the second microelectronic element and the second pad exposed at the first surface, the first conductive element of the second microelectronic element being a second continuous monolithic metal region extending between the rear surface of the second microelectronic element and the second pad exposed at the second surface.

23. The microelectronic assembly as claimed in claim 22, wherein a first portion of the first conductive element of the second microelectronic element disposed between the juxtaposed surfaces of the first pad of the first microelectronic element and the second pad exposed at the second surface has a third width in a direction parallel to the second surface, the third width being greater than a fourth width of an opening in the first pad of the second microelectronic element through which the first conductive element of the second microelectronic element extends.

24. A method of fabricating a microelectronic assembly, comprising:
assembling a first microelectronic element and a second microelectronic element with an interposer therebetween, each of the microelectronic elements embodying active semiconductor devices adjacent a front surface thereof, having a rear surface remote from the respective front surface, and having an electrically conductive pad exposed at the front surface,
the interposer consisting essentially of at least one of semiconductor or an inorganic dielectric material having oppositely facing first and second surfaces and a second conductive element extending through the substrate and being exposed at the first and second surfaces, such that the first surface faces the front surface of the first microelectronic element, and the second surface faces the front surface of the second microelectronic element;
then forming first conductive elements extending within openings extending from rear faces of the microelectronic elements towards the respective front face, at least one of the first conductive elements extending through the respective conductive pad of at least one of the microelectronic elements, the first conductive elements contacting exposed portions of the second conductive element to provide electrical connection therewith, wherein interior surfaces of the openings in the microelectronic elements extend in first and second directions relative to the respective first surface of each microelectronic element to define a substantial angle, wherein a portion of the first conductive element of the first microelectronic element has a first width in a direction parallel to the first surface, the first width being greater than a second width of an opening in the pad of the first microelectronic element.

25. The method as claimed in claim 24, wherein the first conductive element of each of the microelectronic elements extends from the respective rear surface through the respective conductive pad.

26. The method as claimed in claim 25, wherein an opening through the second microelectronic element through which the second conductive element extends has an interior wall extending at a normal angle relative to the first and second surfaces of the interposer.

27. The method as claimed in claim 24, wherein the second conductive element includes second electrically conductive pads exposed at the first and second surfaces, the first conductive pad of each microelectronic element is juxtaposed with one of the second pads, and the first conductive elements contact juxtaposed surfaces of the first and second pads.

28. The method as claimed in claim 27, wherein an opening in the interposer through which the second conductive element extends tapers in a direction between the first and second surfaces of the interposer.

29. The method as claimed in claim 28, wherein the second conductive element conforms to a contour of an interior surface of the opening in the interposer.

30. The method as claimed in claim 28, wherein the second conductive element does not conform to a contour of an interior surface of the opening in the interposer.

31. The method as claimed in claim 30, wherein the opening in the interposer and the second conductive element are tapered in opposite directions.

32. The method as claimed in claim 27, wherein a first portion of the first conductive element of the first microelectronic element disposed between the juxtaposed surfaces of the first pad of the first microelectronic element and the second pad exposed at the first surface has a first width in a direction parallel to the first surface, the first width being greater than a second width of an opening in the first pad of the first microelectronic element through which the first conductive element of the first microelectronic element extends.

33. The method as claimed in claim 32, wherein a first portion of the first conductive element of the second microelectronic element disposed between the juxtaposed surfaces of the first pad of the first microelectronic element and the second pad exposed at the second surface has a third width in a direction parallel to the second surface, the third width being greater than a fourth width of an opening in the first pad of the second microelectronic element through which the first conductive element of the second microelectronic element extends.

* * * * *